(12) United States Patent
Masuda et al.

(10) Patent No.: US 10,002,858 B2
(45) Date of Patent: Jun. 19, 2018

(54) POWER TRANSISTOR MODULE

(71) Applicant: Hitachi, Ltd., Chiyoda-ku, Tokyo (JP)

(72) Inventors: Toru Masuda, Tokyo (JP); Akitoyo Konno, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days. days.

(21) Appl. No.: 15/325,784

(22) PCT Filed: Jul. 15, 2014

(86) PCT No.: PCT/JP2014/068804
§ 371 (c)(1),
(2) Date: Jan. 12, 2017

(87) PCT Pub. No.: WO2016/009496
PCT Pub. Date: Jan. 21, 2016

(65) Prior Publication Data
US 2017/0170157 A1  Jun. 15, 2017

(51) Int. Cl.
| H01L 29/15 | (2006.01) |
| H01L 25/18 | (2006.01) |
| H01L 23/48 | (2006.01) |
| H01L 25/07 | (2006.01) |
| H01L 23/00 | (2006.01) |

(52) U.S. Cl.
CPC .............. H01L 25/18 (2013.01); H01L 23/48 (2013.01); H01L 24/49 (2013.01); H01L 25/072 (2013.01); *H01L 2224/49113* (2013.01); *H01L 2924/13055* (2013.01); *H01L 2924/13091* (2013.01)

(58) Field of Classification Search
CPC ....................................................... H01L 25/18
USPC ........................................................... 257/690
See application file for complete search history.

(56) References Cited

U.S. PATENT DOCUMENTS 5,616,955 A    4/1997  Yamada et al.

FOREIGN PATENT DOCUMENTS

| JP | 7-29932 A | 1/1995 |
| JP | 7-99275 A | 4/1995 |
| JP | 2001-94035 A | 4/2001 |

(Continued)

OTHER PUBLICATIONS

International Search Report (PCT/ISA/210) issued in PCT Application No. PCT/JP2014/068804 dated Oct. 21, 2014 with English-language translation (four (4) pages).

(Continued)

*Primary Examiner* — Jami M Valentine
(74) *Attorney, Agent, or Firm* — Crowell & Moring LLP (57) ABSTRACT

A first conductive pattern includes: a first feeding point for supplying a potential to the first conductive pattern located at one end thereof; one or more diode elements located over the first conductive pattern; and a plurality of switching elements over the first conductive pattern on the opposite side to the first feeding point with the diode elements in between. A second conductive pattern includes a second feeding point that is provided in proximity to the first feeding point and supplies a potential different from that for the first conductive pattern to the second conductive pattern. The plurality of the switching elements is electrically connected with the second conductive pattern through a plurality of bonding wires. The second conductive pattern is provided with a slit pattern that defines an area of connection of the plurality of the bonding wires with the second conductive pattern over the second conductive pattern.

18 Claims, 9 Drawing Sheets

(56) References Cited

FOREIGN PATENT DOCUMENTS

| | | |
|---|---|---|
| JP | 2002-203941 A | 7/2002 |
| JP | 2006-203974 A | 8/2006 |
| JP | 2010-87400 A | 4/2010 |

OTHER PUBLICATIONS

Japanese-language Written Opinion (PCT/ISA/237) issued in PCT Application No. PCT/JP2014/068804 dated Oct. 21, 2014 (four (4) pages).

⇒ : DIRECTION OF CURRENT FLOW DURING TURN-ON

⇒ : DIRECTION OF CURRENT FLOW DURING TURN-ON

⇒ : DIRECTION OF CURRENT FLOW DURING TURN-ON

POWER TRANSISTOR MODULE

TECHNICAL FIELD

The present invention relates to a module configured by mounting a power transistor, such as IGBT or MOSFET, over a circuit board and in particular to an internal wiring structure thereof.

BACKGROUND ART

In power control and motor control for industrial equipment, electric railway vehicles, automobiles, and home appliances, and the like, power transistor modules obtained by mounting a single module with a plurality of switching elements, such as power MOSFETs (Metal-Oxide-Semiconductor-Field-Effect-Transistors) and IGBTs (Insulated-Gate-Bipolar-Transistors), and semiconductor elements, such as freewheel diodes, are used.

Such a power transistor module is configured by: placing a conductive pattern in a predetermined shape over one surface of a heat sink of metal or the like with an insulated substrate in between; mounting a semiconductor element over the conductive pattern by soldering or the like; and electrically connecting the semiconductor element to a terminal for external connection (external lead-out terminal). Hereafter, an insulated substrate and conductive patterns will be collectively referred to as a circuit board.

With respect to such a power transistor module as mentioned above, a plurality of semiconductor elements connected in parallel over a conductive pattern in a predetermined shape within the module may be used so that a large current can be handled. However, when electrical parallel connection is achieved by simply arranging a plurality of semiconductor elements in parallel, a problem arises. The length of a current path to an external lead-out terminal differs depending on the placement position of a semiconductor element over the conductive pattern. As a result, a current value is different from semiconductor element to semiconductor element connected in parallel and a current is converged on some of the semiconductor elements.

When there is variation in current amount among semiconductor elements, the quantity of heat generated from each semiconductor element varies. As a result, a solder joint connecting a semiconductor element to a conductive pattern is different in deterioration from element to element. When a semiconductor element generates especially much heat, a solder joint thereto is most noticeably deteriorated and develops poor connection first in the circuit board, a current being reduced. For this reason, current convergence on another semiconductor element occurs and in the semiconductor element largest in current amount, poor connection is developed in the solder joint thereto for the above-mentioned reason. This eventually leads to a defect event in which the number of elements through which a current can be passed over the circuit board is gradually reduced. As mentioned above, this problem is caused by a difference in the length of a current path between a semiconductor element and an external lead-out terminal, in other words, a difference in impedance.

An example of a technology for reducing variation in impedance in the path from a semiconductor element to an external lead-out terminal is Patent Literature 1. Patent Literature 1 discloses a semiconductor device. In this semiconductor device, an internal junction is provided with a slit to equalize impedance in the path from each semiconductor element to an external lead-out terminal. At the same time, the internal junction is also used as a heat radiation structure. As a result, thermal stress on a bonding wire connecting a semiconductor element and the internal junction can be mitigated.

The semiconductor device in Patent Literature 1 includes: a case; a plurality of semiconductor circuit boards placed in the case and configured by mounting a semiconductor element over an insulated substrate provided with a conductive pattern; an external lead-out terminal for taking a principal current out of the case, a part of the external lead-out terminal being extended into the case; and an internal junction placed along the plurality of the semiconductor substrates and electrically coupled with a main electrode of the semiconductor element, the internal junction including a heat radiation means for maintaining a heat radiation property and a slit structure equalizing the length of the current path from the semiconductor element.

Patent Literature 2 discloses a technology for providing an emitter pattern portion over a circuit board with a slit for sectioning the width of a current path to form an inductance forming region.

According to the power transistor module in Patent Literature 2, even in a wide variety of transistor modules different in specifications, provision of a proper internal wiring inductance can be easily coped with by changing a wire connection point on a circuit pattern without changing a terminal component.

CITATION LIST

Patent Literature

PTL 1: Japanese Patent Application Laid-Open No. 2010-87400

PTL 2: Japanese Patent Application Laid-Open No. Hei 7(1995)-99275

SUMMARY OF INVENTION

Technical Problem

In conventional power transistor modules, as mentioned above, semiconductor elements arranged in parallel over a circuit board are uneven in impedance in a path to an external lead-out terminal connected to the circuit board. This poses a problem that the amount of a current passed through each semiconductor element differs.

The slit structure of the semiconductor device in Patent Literature 1 is provided in an internal junction for connection between the circuit boards, not in the semiconductor circuit boards. Therefore, it is guessed that the slit structure has an effect in equalization of impedance in paths to an external lead-out terminal among circuit boards arranged in parallel but that the slit structure does not have so great an effect in equalization of impedance among parallel chips mounted over a circuit board.

Further, it is conjectured that because of the laminated structure of a plurality of internal junctions made obvious by FIG. 4 in Patent Literature 1, each internal junction is greatly harmfully influence by an interference effect caused by a current of another internal junction. Therefore, it is suspected that the impedance equalization effect of the slit is imperfect and variation in impedance remains between the individual semiconductor elements arranged in parallel and between the circuit boards arranged in parallel.

In the technology in Patent Literature 2, a slit structure is provided over a circuit board constituting a power transistor module. The purpose thereof is limited to equalization of inductance values related to transistors in an upper arm and a lower arm constituting a half bridge and is different from equalization of impedance among parallel chips mounted over the circuit board.

In conventional technologies for adjusting impedance, especially, inductance, such a slit structure as described in Patent Literature 1 or Patent Literature 2 is indeed introduced but is insufficient to equalize impedance of semiconductor elements arranged in parallel.

Consequently, it is an object of the present invention to provide a power transistor module configured by placing a plurality of semiconductor elements in parallel over a circuit board, in which power transistor module impedance in a path from each semiconductor element to an external lead-out terminal is equalized with accuracy and higher reliability is obtained.

Solution to Problem

To solve the above problems, the present invention provides a power transistor module including one or more circuit boards in which a plurality of semiconductor elements is placed over a principal surface of an insulated substrate. The circuit board includes: a first conductive pattern formed over the insulated substrate; and a second conductive pattern formed in a region over the insulated substrate different from the region of the first conductive pattern such that the second conductive pattern is electrically insulated from the first conductive pattern. The first conductive pattern includes: a first feeding point for supplying a potential to the first conductive pattern located at one end thereof; one or more diode elements located over the first conductive pattern; and a plurality of switching elements located over the first conductive pattern on the opposite side to the first feeding point with the diode elements in between. The second conductive pattern includes a second feeding point provided in proximity to the first feeding point and supplying a potential different from that for the first conductive pattern to the second conductive pattern. The plurality of the switching elements is electrically connected with the second conductive pattern through a plurality of bonding wires. The second conductive pattern is provided with a slit pattern that defines an area of connection of the plurality of the bonding wires with the second conductive pattern over the second conductive pattern.

The present invention is a power transistor module including one or more circuit boards in which a plurality of semiconductor elements is placed over a principal surface of an insulated substrate. The circuit board includes: a first conductive pattern formed over the insulated substrate; and a second conductive pattern formed in a region over the insulated substrate different from the region of the first conductive pattern such that the second conductive pattern is electrically insulated from the first conductive pattern. The first conductive pattern includes: a first feeding point for supplying a potential to the first conductive pattern located at one end thereof; and a plurality of switching elements arranged along a direction from the first feeding portion toward an end of the first conductive pattern on the opposite side to the end at which the first feeding portion is provided. The second conductive pattern includes a second feeding point provided in proximity to the first feeding point and supplying a potential different from that for the first conductive pattern to the second conductive pattern. The plurality of the switching elements is electrically connected with the second conductive pattern through a plurality of bonding wires. The second conductive pattern is provided with a slit pattern that defines an area of connection of the plurality of the bonding wires with the second conductive pattern over the second conductive pattern.

Advantageous Effects of Invention

According to the present invention, it is possible to realize a power transistor module configured by arranging a plurality of semiconductor elements in parallel over a circuit board, in which power transistor module impedance in a path from each semiconductor element to an external lead-out terminal is equalized with accuracy and higher reliability is obtained.

Other problems, configuration elements, and effects than described above will be apparent from the following description of embodiments.

DESCRIPTION OF EMBODIMENTS

Hereafter, a description will be given to embodiments of the present invention with reference to the drawings.

First Embodiment

In relation to this embodiment, a description will be given to a power transistor module in which impedance of semiconductor elements arranged in parallel is equalized.

Figure 2A:
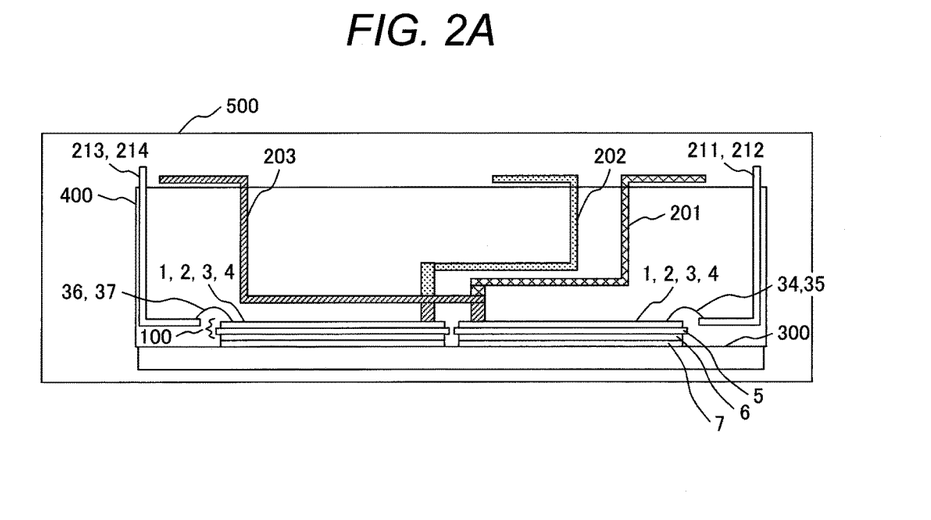
FIG. 2A is a cross-sectional view of a power transistor module in one embodiment of the present invention.
Figure 2B:
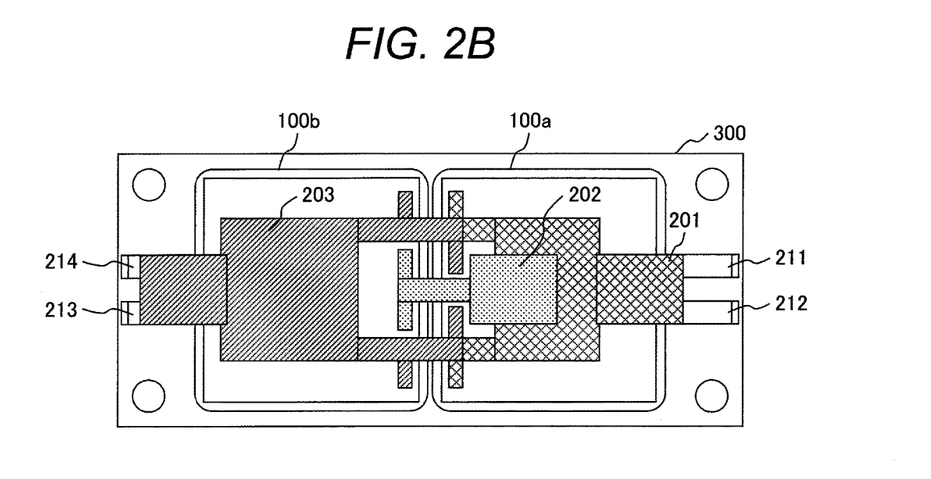
FIG. 2B is a plan view of a power transistor module in one embodiment of the present invention.

FIG. 2A and FIG. 2B illustrate a configuration of a power transistor module in this embodiment. FIG. 2A and FIG. 2B are respectively a cross-sectional view and a plan view of the power transistor module. Referring to FIG. 2A and FIG. 2B, the power transistor module 500 includes a case 400, a metal base 300, external lead-out terminals 201 to 203, control signal terminals 211 to 214, circuit boards 100, and a solder joint layer 7. The case 400 defines an outside shape of the module and is made of insulative resin. Hereafter, a description of the case 400 will be omitted unless especially necessary.

The metal base 300, together with the case 400, defines an outside shape of the module and is made of a metal material. In contact with a heat dump (not shown), the metal base functions as a path for dissipating heat generated from one or more circuit boards 100 joined at the solder joint layer 7.

The external lead-out terminals 201 to 203 are terminals for connecting a conductive pattern over the circuit boards 100 and a main circuit external to the module and provide paths for inputting and outputting a conducting current of the module.

The control signal terminals 211 to 214 are terminals for electrically connecting a conductive pattern over the circuit boards 100 and a control signal generation circuit external to the module through bonding wires 61 to 64 and provide paths for control signals for the switching elements in the module.

The circuit boards 100 include conductive patterns 1 and 2, control signal conductive patterns 3 and 4 for the switching elements, an insulated substrate 5, and a conductive pattern 6. The number of circuit boards 100 used in the power transistor module is determined according to a rated current carrying capacity thereof and functions determined by the conductive patterns.

The solder joint layer 7 mechanically and electrically connects the circuit boards 100 and the metal base 300.

As illustrated in FIG. 2B, the power transistor module in this embodiment is constructed using two circuit boards: a circuit board 100a and a circuit board 100b. The external lead-out terminal 201 connects to a conductive pattern of the circuit board 100a brought to a high potential; the external lead-out terminal 202 connects to a conductive pattern of the circuit board 100b brought to a low potential; and the external lead-out terminal 203 has a function to connect a conductive pattern of the circuit board 100a brought to a low potential and a conductive pattern of the circuit board 100b brought to a high potential.

The positions where the external lead-out terminals of a high potential and a low potential are connected in the circuit board 100a and the circuit board 100b are located in proximity to each other as much as possible to the extent that no problem arises in terms of packaging technology or insulation design. This is intended to reduce the loop area of a path through which a current flows a conductive pattern at a high potential to a conductive pattern at a low potential as much as possible to minimize inductance produced in the current path.

Figure 3A:
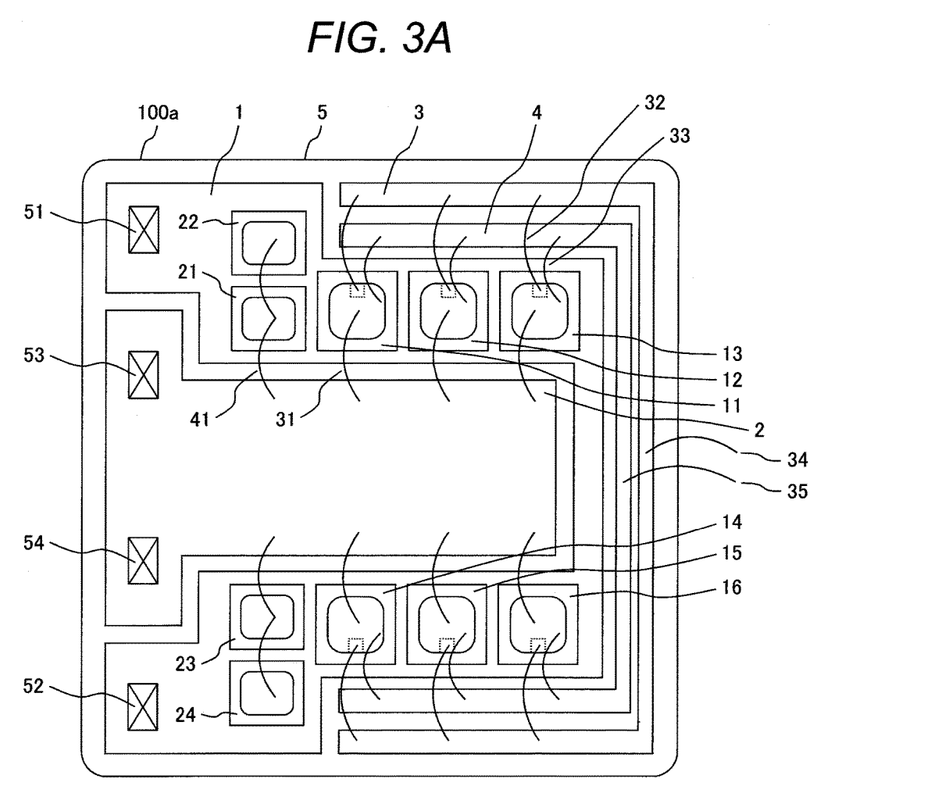
FIG. 3A is a drawing illustrating a configuration of a conventional power transistor module.

FIG. 3A illustrates an exemplary placement of a conductive pattern and semiconductor elements in a circuit board 100a in a conventional power transistor module. The circuit board 100a includes: a high-potential conductive pattern 1, a low-potential conductive pattern 2, control signal conductive patterns 3 and 4 for switching elements, diode elements 21 to 24 and switching elements 11 to 16 formed of semiconductor, and bonding wires 31 to 33 and 41 connecting the semiconductor elements. The conductive pattern 1 is electrically connected with the cathode terminals of the diode elements 21 to 24 formed of semiconductor and is electrically connected with a collector terminal or a drain terminal of the switching elements 11 to 16 formed of semiconductor. Further, feeding positions 51 and 52 for connection with the external lead-out terminal 201 are located there.

The conductive pattern 2 is electrically connected with the anode terminals of the diode elements 21 to 24 through a bonding wire 41 and is electrically connected with a collector terminal or a drain terminal of the switching elements 11 to 16 through a bonding wire 31. Further, feeding positions 53 and 54 for connection with the external lead-out terminal 203 are located there.

The control signal conductive pattern 3 for the switching elements is electrically connected with the gate terminals of the switching elements through a bonding wire 32 and is connected with a control signal generation circuit (not shown) external to the module through a bonding wire 61.

The control signal conductive pattern 4 for the switching elements is electrically connected with the source terminals of the switching elements through a bonding wire 33 and is connected with a control signal generation circuit (not shown) external to the module through a bonding wire 62.

The feeding positions 51 and 52 for connection with the external lead-out terminal 201 and the feeding positions 53 and 54 for connection with the external lead-out terminal 203 are located in proximity to each other to reduce inductance of a current path running through the circuit board 100a.

Figure 4:
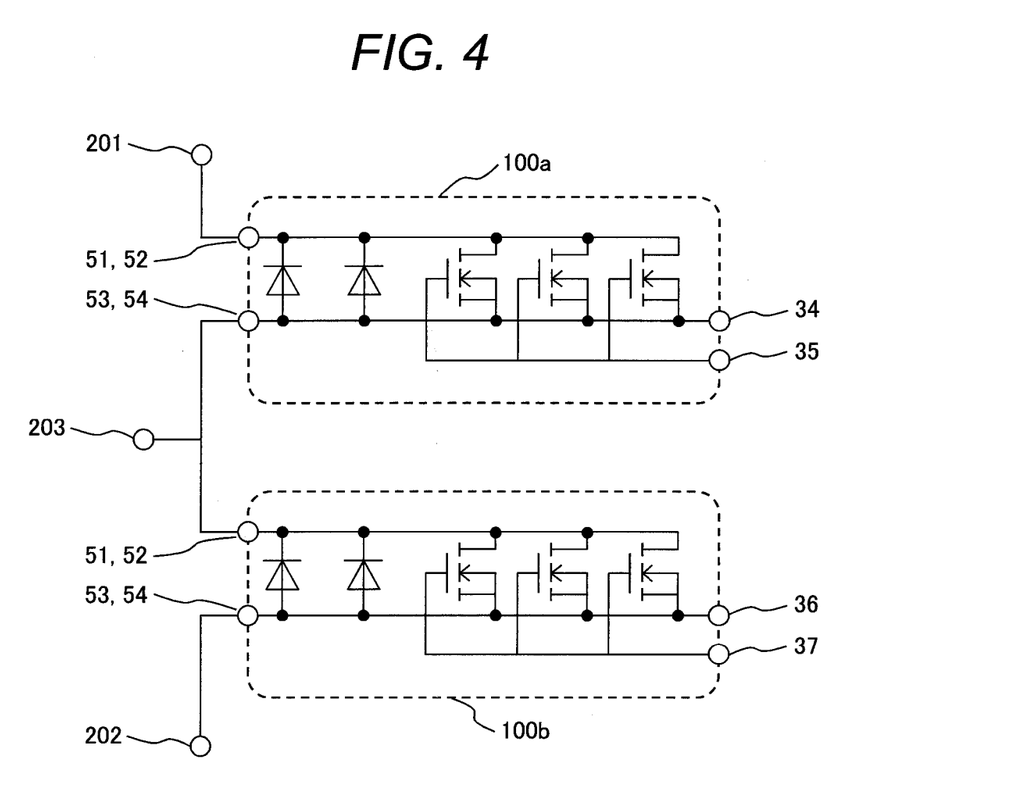
FIG. 4 is a drawing illustrating an equivalent circuit of a conventional power transistor module.

FIG. 4 illustrates an equivalent circuit obtained when the circuit board shown in FIG. 3A is mounted in the power transistor module shown in FIG. 2A. In this example, it is assumed that FET-type switching elements are mounted over the circuit boards 100a and 100b. However, even when the switching elements are of an IGBT type, the effect of the present invention is not impaired, needless to add.

The equivalent circuit of a power transistor module shown in FIG. 4 is a half bridge circuit in which the upper arm is formed of the circuit board 100a and the lower arm is formed of the circuit board 100b. The external lead-out terminal 201 provides a main terminal on the high potential side; the external lead-out terminal 202 provides a main terminal on the low potential side; and the external lead-out terminal 203 provides a main terminal for an intermediate potential. This exemplary equivalent circuit of the circuit boards is a parallel circuit of two diode elements and three FET elements. As mentioned above, the problem to be solved by the present invention is unevenness of a current among the three FET elements, especially, unevenness of a transient current produced during switching of the power transistor module.

Figure 3B:
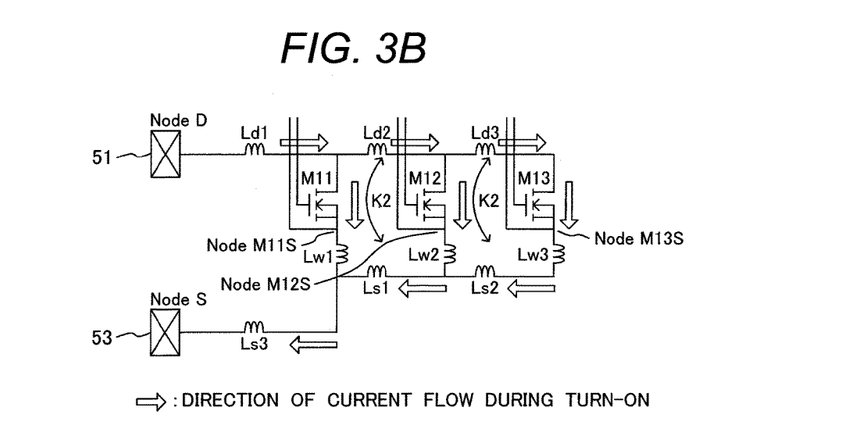
FIG. 3B is a drawing illustrating in part an equivalent circuit of a conventional power transistor module.

A description will be given to unevenness of a current of a power transistor module using a conventional circuit board, that is, a circuit board in which a slit is not provided in a conductive pattern over the circuit board with reference to FIG. 3B. FIG. 3B is an equivalent circuit obtained by simplifying the upper half of the element arrangement in FIG. 3A. Since in this equivalent circuit, attention is focused on a current path formed when a power transistor module mounted with this circuit board is turned on, the diode elements are omitted.

Node D designates a feeding position 51 for connection of the conductive pattern 1 with the external lead-out terminal 201; and inductors Ld1 to Ld3 indicate the inductances of the current path on the conductive pattern 1 from Node D toward the drains of FET elements M11 to M13. At the sources of the FET elements M11 to M13, inductors Lw1 to Lw3 are placed as equivalent circuit expressions of bonding wires and Ls1 to Ls3 are placed as the inductance of the current path on the conductive pattern 2. Node S designates a feeding position 53 for connection with the external lead-out terminal 203 over the conductive pattern 2. The direction of a current flow is indicated by arrows in the drawing.

Magnetic coupling is generated between the inductor Ld2 on the conductive pattern 1 and the inductor Ls1 on the conductive pattern 2 through a gap between the patterns and has a mutual inductance M2 determined by a coupling coefficient K2. In this configuration, the feeding position 51 for connection with the external lead-out terminal 201 and the feeding position 53 for connection with the external lead-out terminal 203 are placed in proximity to each other. The direction of a current flow is opposite between the conductive pattern 1 and the conductive pattern 2. Therefore, the mutual inductance has an effect of canceling out (reducing) their respective self inductances. This is also the case with the inductor Ld3 and the inductor Ls2.

A description will be given to unevenness of a current with reference to this equivalent circuit. As shown in FIG. 3B, when each FET element is brought into conduction (turned on), three current paths are generated. That is, three paths running through the FET elements M11, M12, M13 are generated. It is assumed that an equal rate of change (di/dt) in transient current occurs in the individual paths and a total inductance of each path is determined:

In case of path M11:

$$Ld1+Lw1+Ls3 \qquad \text{[Formula 1]}$$

In case of path M12:

$$Ld1+Ld2+Lw2+Ls1+Ls3-2M2 \qquad \text{[Formula 2]}$$

where, $M2 \geq 0$.
In case of path M13:

$$Ld1+Ld2+Ld3+Lw3+Ls2+Ls1+Ls3-4M2 \qquad \text{[Formula 3]}$$

When Ld is taken as a value of Ld1 to Ld2 and Ls is taken as a value of Ls1 to L3, the following formulas are obtained:
In case of path M11:

$$Ld+Lw+Ls \qquad \text{[Formula 4]}$$

In case of path M12:

$$2Ld+Lw+2Ls-2M2 \qquad \text{[Formula 5]}$$

where, $M2 \geq 0$.
In case of path M13:

$$3Ld+Lw+3Ls-4M2 \qquad \text{[Formula 6]}$$

For example, when the inductance of path M11 and that of M13 are compared, a difference is as follows:

$$2(Ld+Ls-2M2) \qquad \text{[Formula 7]}$$

When $Ld+Ls=2M2$, the paths M11 and M13 are equal to each other in inductance but this is satisfied only when coupling coefficient K2=1. In reality, $K2<1$ and thus a difference in inductance is produced between the paths M11 and M13. This example is on the assumption that all the current paths are equal in di/dt but an inductance difference is produced from path to path, as mentioned above. Therefore, when electromotive force $dV(=di/dt \cdot L)$ between Node D and Node S is taken as a basis, the di/dt of each of the paths M11 to M13 respectively takes a different value.

For example, since di/dt of the path M11 is greater than di/dt of the path M13, unevenness in allotted current is generated between the paths. Since the degree of unevenness depends on a difference in inductance, a means is required for equalizing an inductance of the path of each switching element.

A description will be given to a configuration of the power transistor module in this embodiment and an effect thereof with reference to FIG. 5A and FIG. 5B. In the circuit board in FIG. 5A, two L-shaped slit patterns 62 are provided in the conductive pattern 2 in addition to the configuration described with reference to FIG. 3A. In this circuit board, a measure is taken with respect to the following feeding positions placed in proximity to one another: the feeding position 51 for connection with the external lead-out terminal 201 and the feeding position 53 for connection with the external lead-out terminal 203 or the feeding position 52 for connection with the external lead-out terminal 201 and the feeding position 54 for connection with the external lead-out terminal 203. That is, the diode elements are placed closer thereto and the FET elements are placed farther therefrom; and the slit patterns 62 are so arranged that the direction in which the FET elements are placed is matched with the longitudinal direction of each slit pattern 62.

A more specific description will be given. Each slit pattern 62 is formed in an L shape within the conductive pattern 2; an area of connection between a plurality of bonding wires and the conductive pattern 2 is provided in an area enclosed with the L-shaped slit pattern 62 and two sides of the conductive pattern 2 including a side located on the opposite side to a side of the conductive pattern 2 in proximity to the feeding position 53 for connection with the external lead-out terminal 203.

Figure 5A:
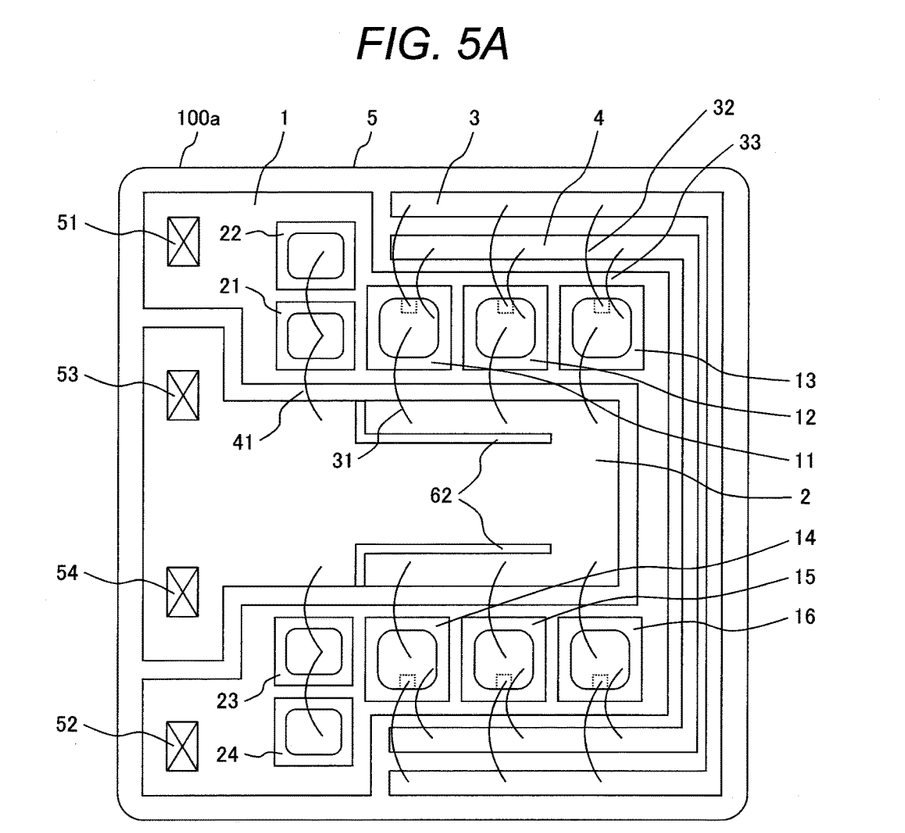
FIG. 5A is a drawing illustrating a configuration of a power transistor module in one embodiment of the present invention.
Figure 5B:
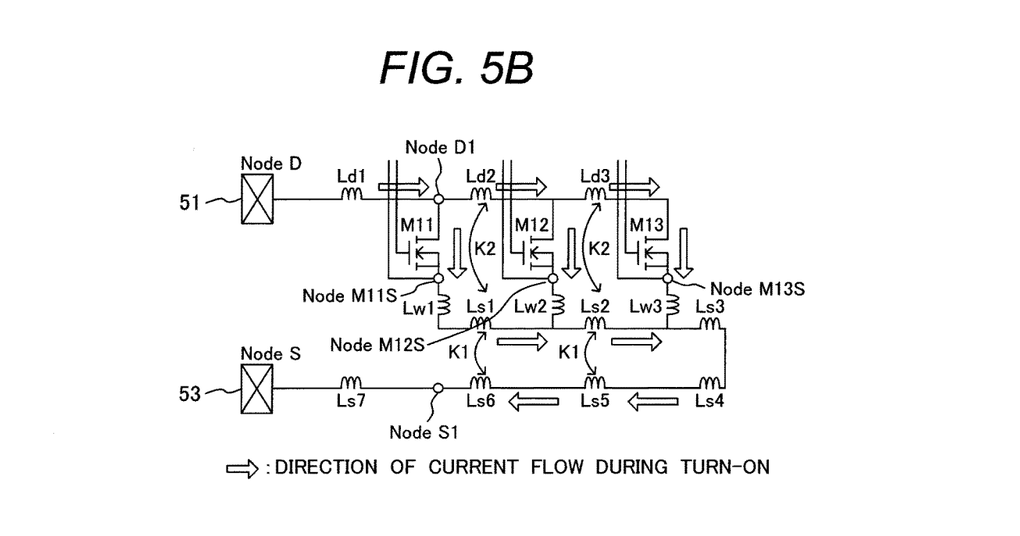
FIG. 5B is a drawing illustrating in part an equivalent circuit of a power transistor module in one embodiment of the present invention.

FIG. 5B is an equivalent circuit obtained by simplifying the upper half of the element arrangement in FIG. 5A. Since in this equivalent circuit, attention is focused on a current path formed when a power transistor module mounted with this circuit board is turned on, the diode elements are omitted. Node D designates the feeding position 51 for connection of the conductive pattern 1 with the external lead-out terminal 201; and inductors Ld1 to Ld3 indicate the inductances of the current path on the conductive pattern 1 from Node D toward the drains of FET elements M11 to M13.

At the sources of the FET elements M11 to M13, inductors Lw1 to Lw3 are placed as equivalent circuit expressions of bonding wires and Ls1 to Ls7 are placed as the inductance of the current path on the conductive pattern 2. The current path of the conductive pattern 2 is extended by the slit patterns 62 and magnetic coupling is generated by mutual inductance. Node S designates the feeding position 53 for connection with the external lead-out terminal 203 over the conductive pattern 2. The direction of a current flow is indicated by arrows in the drawing.

Magnetic coupling is generated between the inductor Ld2 on the conductive pattern 1 and the inductor Ls1 on the conductive pattern 2 through a gap between the patterns and has a mutual inductance M2 determined by a coupling coefficient K2. Since the directions in which a current flows are identical, M2 increases coupled self inductances. This is also the same with the relation between the inductor Ld3 and the inductor Ls2.

At Ls1 and Ls6 magnetically coupled through the slit pattern 62, the directions of a current flow are opposite; therefore, the mutual inductance M1 has an effect of reducing self inductances. This is also the same with the relation between the inductors Ls2 and Ls5.

A description will be given to an effect of this embodiment with reference to this equivalent circuit. As described with reference to FIG. 3B, when the FET elements are brought into conduction (turned on), three current paths are generated. It is assumed that an equal rate of change (di/dt) in transient current occurs in the individual paths and a total inductance of each path is determined. Here, M1≥0, M2≥0.

In case of path M11:

$$Ld1+Lw1+Ls1+Ls2+Ls3+Ls4+Ls5+Ls6+Ls7-4M1+2M2 \quad \text{[Formula 8]}$$

In case of path M12:

$$Ld1+Ld2+Lw2+Ls2+Ls3+Ls4+Ls5+Ls6+Ls7-3M1+2M2 \quad \text{[Formula 9]}$$

In case of path M13:

$$Ld1+Ld2+Ld3+Lw3+Ls3+Ls4+Ls5+Ls6+Ls7-2M1+2M2 \quad \text{[Formula 10]}$$

When Ld is taken as a value of Ld1 to Ld3 and Ls is taken as a value of Ls1 to L7, the following formulas are obtained:

In case of path M11:

$$Ld+Lw+7Ls-4M1+2M2 \quad \text{[Formula 11]}$$

In case of path M12:

$$2Ld+Lw+6Ls-3M1+2M2 \quad \text{[Formula 12]}$$

In case of path M13:

$$3Ld+Lw+5Ls-2M1+2M2 \quad \text{[Formula 13]}$$

For example, when the inductance of path M11 and that of M13 are compared, a difference is as follows:

$$2(Ld+Ls-1M1) \quad \text{[Formula 14]}$$

When this is compared with a difference in inductance from path to path in the conventional circuit board (Formula 7), a difference in inductance between the path M11 and the path M13 is identical if M1=2M2. In the circuit board pattern in this embodiment, the absolute value of inductance of each path is increased by the introduction of the slit pattern 62. Therefore, variation in inductance (ratio of a difference in inductance from path to path to an average value of the inductances of the individual paths) can be reduced.

For example, when it is assumed that Ld=2 nH, Lw=5 nH, Ls=3 nH, M1=3 nH, and M2=2 nH, variation among the switching transistor paths M11 to M13 in the conventional circuit board pattern shown by the equivalent circuit in FIG. 3B is 36%. Meanwhile, variation among the switching transistor paths M11 to M13 in the circuit board pattern in this embodiment shown by the equivalent circuit in FIG. 5B is 18% and thus variation can be obviously reduced.

An average of the absolute value of inductance is 11 nH in the case of the conventional circuit board pattern shown by the equivalent circuit in FIG. 3B and 22 nH in the case of this embodiment. It can be seen from the above description that the circuit board pattern in this embodiment into which the slit patterns 62 are introduced reduces variation in inductance of the current paths of FET elements arranged in parallel and improves the evenness of inductance values.

Second Embodiment

Figure 1A:
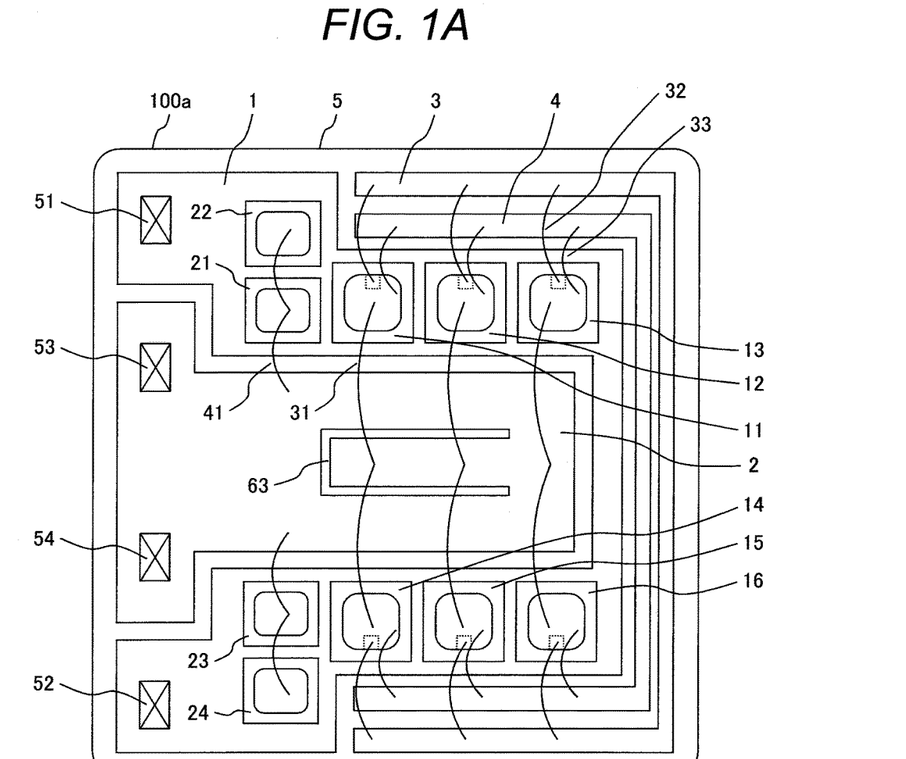
FIG. 1A is a drawing illustrating a configuration of a power transistor module in one embodiment of the present invention.

A description will be given to the second embodiment of the present invention and an effect thereof with reference to FIG. 1A and FIG. 1B. The circuit board pattern in FIG. 1A is obtained by replacing the slit patterns 62 in FIG. 5A described in relation to the first embodiment with a single U-shaped slit pattern 63 placed within the conductive pattern 2, as illustrated in the drawing.

That is, the slit pattern 63 is formed in a U shape within the conductive pattern 2 and an area of connection between a plurality of bonding wires and the conductive pattern 2 is provided in an area enclosed with the U-shaped slit pattern 63 and a side of the conductive pattern 2 on the opposite side to a side thereof in proximity to the feeding position 53 for connection with the external lead-out terminal 203.

In this circuit board 100a, as in the first embodiment, a measure is taken with respect to the following feeding positions placed in proximity to one another: the feeding position 51 for connection with the external lead-out terminal 201 and the feeding position 53 for connection with the external lead-out terminal 203 or the feeding position 52 for connection with the external lead-out terminal 201 and the feeding position 54 for connection with the external lead-out terminal 203. That is, the diode elements are placed closer thereto and the FET elements are placed farther therefrom; and the slit pattern 63 is so arranged that the direction in which the FET elements are placed is matched with the longitudinal direction of the slit pattern 63. Further, placement of the slit pattern 63 within the conductive pattern 2 brings about the following two advantages:

The first advantage is that: the conductive pattern 2 can also be used as placement points of bonding wires from the source electrodes of the FET elements vertically symmetrically disposed in the circuit board 100a and thus the area of the conductive pattern 2 can be reduced. In the first embodiment, an area for disposing bonding wires is provided above and below the conductive pattern. In the circuit board pattern in this embodiment, the conductive pattern can also be used for this purpose and the bonding wire area can be reduced to approximately ½.

The second advantage is that: the direction of a current flowing in the circuit board 100a is opposed between all the adjoining patterns. As a result, mutual inductance by magnetic coupling between adjoining patterns has an effect of reducing self inductances and it is possible to suppress increase in the absolute value of inductance that is a reaction of slit introduction. A detailed description will be given to this working effect with reference to FIG. 1B.

Figure 1B:
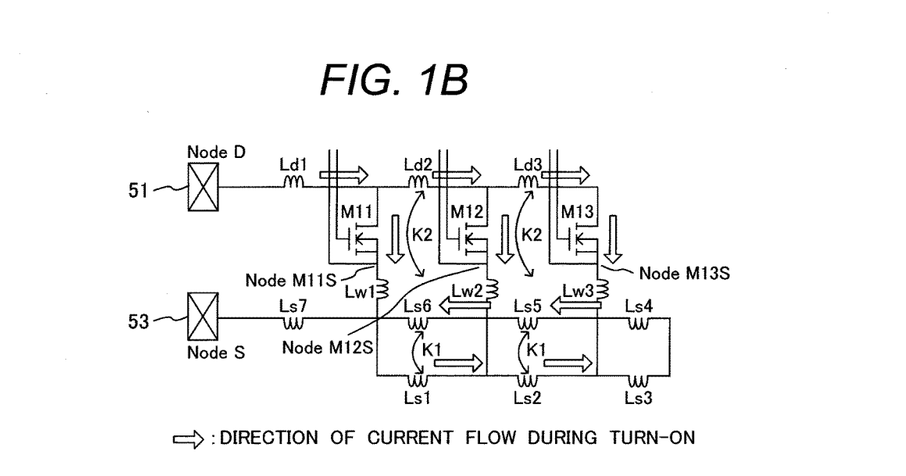
FIG. 1B is a drawing illustrating in part an equivalent circuit of a power transistor module in one embodiment of the present invention.

FIG. 1B is an equivalent circuit obtained by simplifying the upper half of the element arrangement in FIG. 1A. Since in this equivalent circuit, attention is focused on a current path formed when a power transistor module mounted with this circuit board 100a is turned on, the diode elements are omitted. Node D designates the feeding position 51 for connection of the conductive pattern 1 with the external lead-out terminal 201; and inductors Ld1 to Ld3 indicate the inductance of the current path on the conductive pattern 1 from Node D toward the drains of FET elements M11 to M13. At the sources of the FET elements M11 to M13, inductors Lw1 to Lw3 are placed as equivalent circuit expressions of bonding wires and Ls1 to Ls7 are placed as the inductance of the current path on the conductive pattern 2.

The current path of the conductive pattern 2 is extended by the slit pattern 63 and magnetic coupling is generated by mutual inductance. Node S designates the feeding position 53 for connection with the external lead-out terminal 203 over the conductive pattern 2. The direction of a current flow is indicated by arrows in the drawing.

Magnetic coupling is generated between the inductor Ld2 on the conductive pattern 1 and the inductor Ls6 on the conductive pattern 2 through a gap between the patterns and has a mutual inductance M2 determined by a coupling coefficient K2. Since the directions in which a current flows are opposite in this embodiment, M2 reduces coupled self inductances. This is also the same with the relation between the inductor Ld3 and the inductor Ls5.

At Ls1 and Ls6 magnetically coupled through the slit pattern 63, the directions of a current flow are opposite; therefore, the mutual inductance M1 determined by a coupling coefficient K1 has an effect of reducing self inductances. This is also the same with the relation between the inductors Ls2 and Ls5. A description will be given to an effect of this embodiment with reference to this equivalent circuit.

As described with reference to FIG. 3B, when the FET elements are brought into conduction (turned on), three current paths are generated. It is assumed that an equal rate of change (di/dt) in transient current occurs in the individual paths and a total inductance of each path is determined. Here, M1≥0, M2≥0.

In case of path M11:

$$Ld1+Lw1+Ls1+Ls2+Ls3+Ls4+Ls5+Ls6+Ls7-4M1-2M2 \quad \text{[Formula 15]}$$

In case of path M12:

$$Ld1+Ld2+Lw2+Ls2+Ls3+Ls4+Ls5+LS6+Ls7-3M1-2M2 \quad \text{[Formula 16]}$$

In case of path M13:

$$Ld1+Ld2+Ld3+Lw3+Ls3+Ls4+Ls5+Ls6+Ls7-2M1-2M2 \quad \text{[Formula 17]}$$

When Ld is taken as a value of Ld1 to Ld3 and Ls is taken as a value of Ls1 to L7, the following formulas are obtained:

In case of path M11:

$$Ld+Lw+7Ls-4M1-2M2 \quad \text{[Formula 18]}$$

In case of path M12:

$$2Ld+Lw+6Ls-3M1-2M2 \quad \text{[Formula 19]}$$

In case of path M13:

$$3Ld+Lw+5Ls-2M1-2M2 \quad \text{[Formula 20]}$$

For example, when the inductance of path M11 and that of M13 are compared, a difference is as follows:

$$2(Ld+Ls-1M1) \quad \text{[Formula 21]}$$

For example, when it is assumed that Ld=2 nH, Lw=5 nH, Ls=3 nH, M1=3 nH, and M2=2 nH, variation among the switching transistor paths M11 to M13 in the conventional circuit board pattern shown by the equivalent circuit in FIG. 3B is 36%. Meanwhile, variation among the switching transistor paths M11 to M13 in the circuit board pattern in this embodiment shown by the equivalent circuit in FIG. 5B is 27% and thus variation can be obviously reduced.

An average of the absolute value of inductance is 11 nH in the case of the conventional circuit board pattern shown by the equivalent circuit in FIG. 3B and approximately 15 nH in the case of this embodiment. Thus, it is obvious that this embodiment can keep a lower inductance than in the first embodiment and reduce variation in inductance from path to path. It can be seen from the above description that the circuit board pattern in this embodiment into which the slit pattern 63 is introduced reduces both inductances and variation in inductance of the current paths of FET elements arranged in parallel.

Third Embodiment

Figure 6:
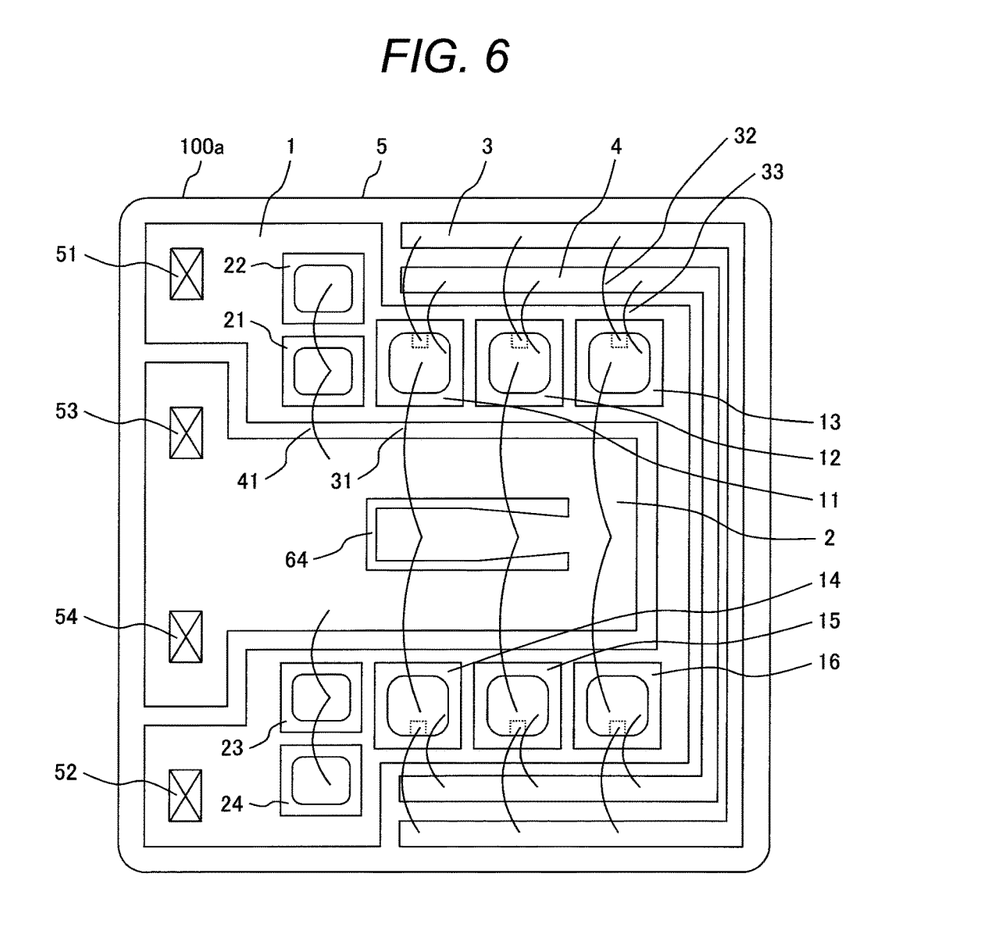
FIG. 6 is a drawing illustrating a configuration of a power transistor module in one embodiment of the present invention.

A description will be given to the third embodiment of the present invention and an effect thereof with reference to FIG. 6. The circuit board pattern in FIG. 6 is obtained by adding a measure to the slit pattern described in relation to the second embodiment with respect to the following feeding positions: the feeding position 51 for connection with the external lead-out terminal 201 and the feeding position 53 for connection with the external lead-out terminal 203 or the feeding position 52 for connection with the external lead-out terminal 201 and the feeding position 54 for connection with the external lead-out terminal 203. That is, as illustrated in the drawing, the slit width of the slit pattern is monotonically increased as it goes farther therefrom. This substantially U-shaped slit pattern 64 having an uneven slit width enables the absolute value of inductance to be adjusted in addition to the effect described in relation to the second embodiment. That is, use of the circuit board 100a in this embodiment brings about an advantage that the absolute value of inductance and the value of variation can be adjusted by changing only the design of a slit pattern width of the circuit board.

Fourth Embodiment

Figure 7:
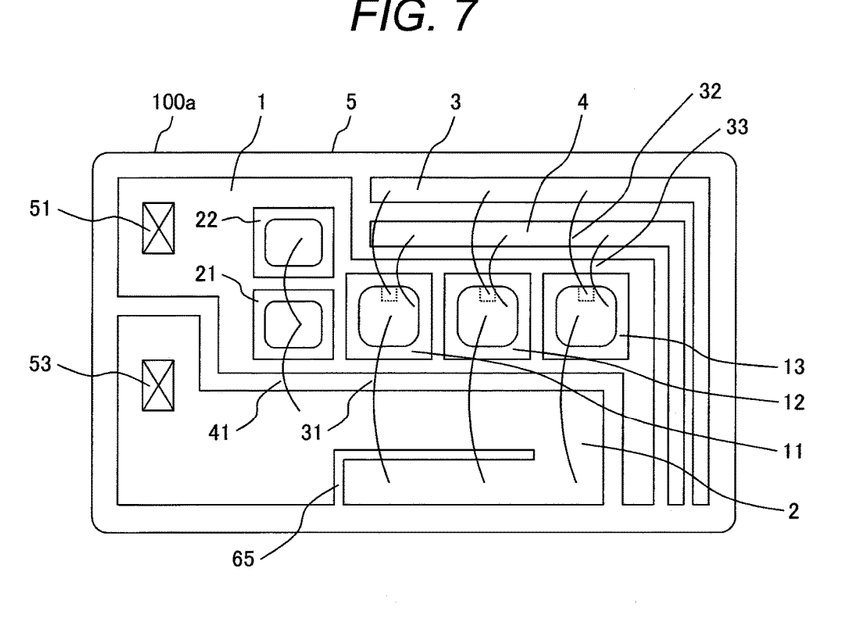
FIG. 7 is a drawing illustrating a configuration of a power transistor module in one embodiment of the present invention.

A description will be given to the fourth embodiment of the present invention and an effect thereof with reference to FIG. 7 to FIG. 9. The circuit board pattern in FIG. 7 is a circuit board pattern comprised of the configuration of the upper half of the circuit board pattern in FIG. 1A described in relation to the second embodiment. In the description of the first embodiment to the third embodiment, the conductive pattern 1 is provided on both sides of the circuit board 100a. That is, the conductive pattern 1 is provided at the upper part and the lower part of the circuit board 100a with the conductive pattern 2 of the circuit board 100a in FIG. 1A, FIG. 5A, and FIG. 6 in between; and a plurality of diode elements and a plurality of switching elements are placed over the individual conductive patterns 1. In the circuit board 100a in this embodiment, as illustrated in FIG. 7, a plurality of diode elements and switching elements is provided on one side of the circuit board 100a, that is, the upper half area in FIG. 7; and the conductive pattern 2 is provided on the other side of the circuit board 100a, that is, the lower half area in FIG. 7. Even in this embodiment, such an effect as described in relation to the first embodiment to the third embodiment can be obtained by providing the conductive pattern 2 thereof with such an L-shaped slit 65 as shown in FIG. 7.

Figure 8:
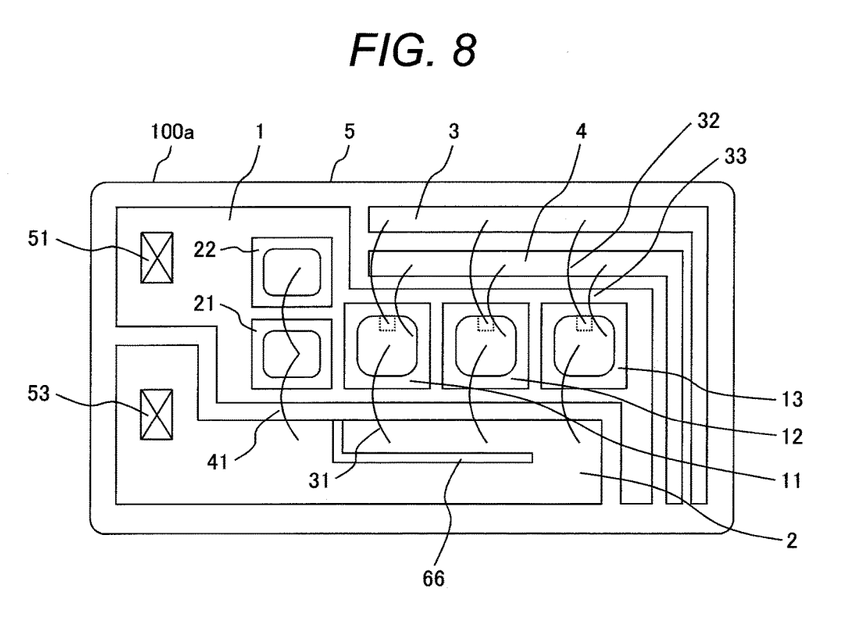
FIG. 8 is a drawing illustrating a configuration of a power transistor module in one embodiment of the present invention.
Figure 9:
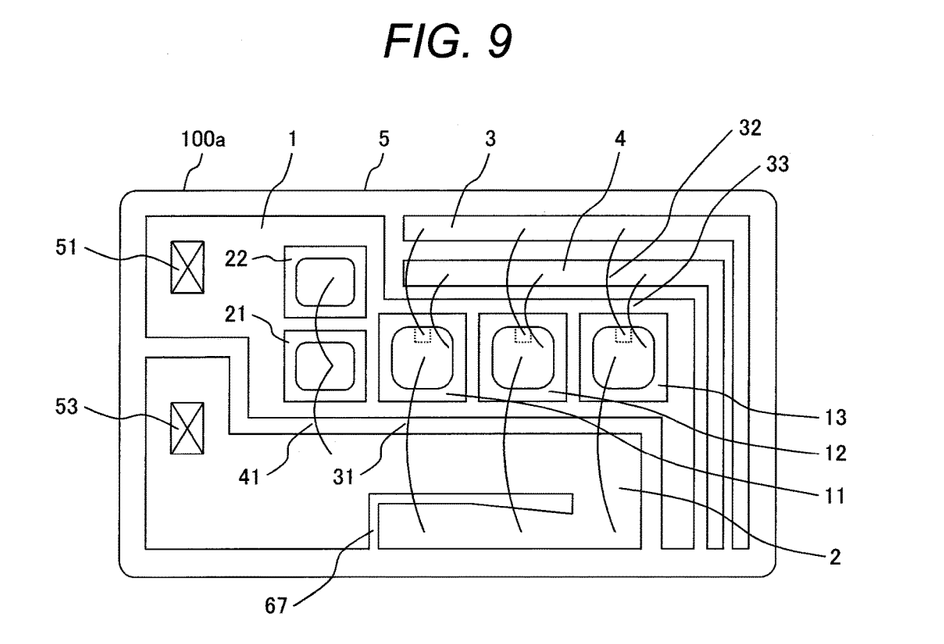
FIG. 9 is a drawing illustrating a configuration of a power transistor module in one embodiment of the present invention.

Similarly, the same effect as in the first embodiment to the third embodiment can be obtained by providing the conductive pattern 2 of the circuit board 100a illustrated in FIG. 8 or FIG. 9 respectively with an L-shaped slit 66 or a substantially L-shaped slit 67. The circuit board 100a in FIG. 8 has a circuit board pattern comprised of the configuration of the upper half of the circuit board pattern in FIG. 5A; and the circuit board 100a in FIG. 9 has a circuit board pattern comprised of the configuration of the upper half of the circuit board pattern in FIG. 6.

Figure 10:
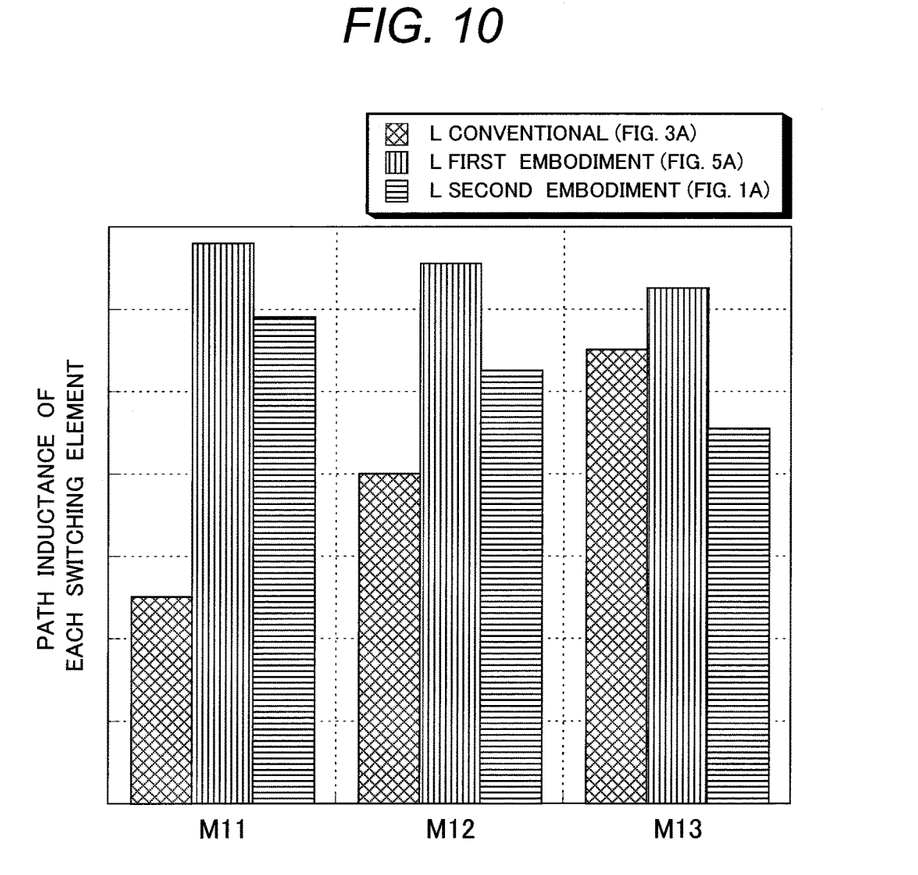
FIG. 10 is a drawing illustrating an effect of a power transistor module of the present invention.

FIG. 10 illustrates an effect obtained when the circuit board 100a described in relation to the first embodiment and the second embodiment is used. FIG. 10 indicates an inter-comparison of path inductances in the switching elements M11 to M13.

It can be seen from the drawing that: in the conventional circuit board 100a shown in FIG. 3A, the path inductance of each switching element greatly varies but the variation is improved and the path inductances are substantially equalized in the circuit board 100a shown in FIG. 5A (First Embodiment) and the circuit board 100a shown in FIG. 1A (Second Embodiment).

The present invention is not limited to the above-mentioned embodiments and includes various modifications. The above embodiments have been described in detail for making the present invention easily understandable and need not include all the configuration elements described above. A part of the configuration elements of an embodiment may be replaced with a configuration element of another embodiment; and a configuration element of an embodiment may be added to the configuration elements of another embodiment. A different configuration element may be added to or replaced with a part of the configuration elements of each embodiment and a part of the configuration elements of each embodiment may be deleted.

For example, the switching elements of MOSFETs (Metal-Oxide-Semiconductor-Field-Effect-Transistors) used in each embodiment may be replaced with either unipolar devices of J-FETs (Junction-Field-Effect-Transistors) or such bipolar devices as IGBTs (Insulated-Gate-Bipolar-Transistors). Further, with respect to the functions of the terminals, for example, the drain may be replaced with a collector; the source may be replaced with an emitter; and the gate may be replaced with a base. Even in this case, the effect of the present invention is not lessened.

This is the same with the diode elements. Even when PN-junction diodes or SB (Shottky-Barrier-junction) diodes are used, the effect of the present invention is not lessened. Further, a diode may be formed in the switching elements and a discrete diode element may be not mounted over the circuit board 100a described in relation to each embodiment. Even in this case, the same effect as in each embodiment can be obtained by providing a slit pattern in the conductive pattern 2 as described in relation to each embodiment.

REFERENCE SIGNS LIST 1, 2, 6—Conductive pattern,
3, 4—Control signal conductive pattern for switching element,
5—Insulated substrate,
7—Solder joint layer,
11, 12, 13, 14, 15, 16—Switching element,
21, 22, 23, 24—Diode element,
31, 32, 33, 34, 35, 36, 37, 41—Bonding wire,
51, 52—Feeding position for connection with external lead-out terminal 201,
53, 54—Feeding position for connection with external lead-out terminal 203,
62, 63, 64, 65, 66, 67—Slit pattern,
100, 100a, 100b—Circuit board,
201, 202, 203—External lead-out terminal,
211, 212, 213, 214—Control signal terminal,
300—Metal base,
400—Case,
500—Power transistor module,
K1, K2—Coupling coefficient,
Ld1, Ld2, Ld3, Lw1, Lw2, Lw3, Ls1, Ls2, Ls3, Ls4, Ls5, Ls6, Ls7—Inductor,
M1, M2—Mutual inductance,
M11, M12, M13—FET element.

The invention claimed is:

1. A power transistor module including one or more circuit boards in which a plurality of semiconductor elements is placed over a principal surface of an insulated substrate,
wherein the circuit board includes:
a first conductive pattern formed over the insulated substrate; and
a second conductive pattern formed in a region over the insulated substrate different from the region of the first conductive pattern such that the second conductive pattern is electrically insulated from the first conductive pattern,
wherein the first conductive pattern includes:
a first feeding point for supplying a potential to the first conductive pattern located at one end thereof;
one or more diode elements located over the first conductive pattern;
a plurality of switching elements located over the first conductive pattern on the opposite side to the first feeding point with the diode elements in between,
wherein the second conductive pattern includes:
a second feeding point that is provided in proximity to the first feeding point and supplies a potential different from that for the first conductive pattern to the second conductive pattern,
wherein the plurality of the switching elements is electrically connected with the second conductive pattern through a plurality of bonding wires,
wherein the second conductive pattern is provided with a slit pattern that defines an area of connection of the plurality of the bonding wires with the second conductive pattern over the second conductive pattern, and
wherein a slit width of the slit pattern is monotonically increased as it goes farther away from the second feeding point in the second conductive pattern.

2. A power transistor module including one or more circuit boards in which a plurality of semiconductor elements is placed over a principal surface of an insulated substrate,
wherein the circuit board includes:
a first conductive pattern formed over the insulated substrate; and
a second conductive pattern that is formed in a region over the insulated substrate different from the region of the first conductive pattern such that the second conductive pattern is electrically insulated from the first conductive pattern,
wherein the first conductive pattern includes:
a first feeding point for supplying a potential to the first conductive pattern located at one end thereof; and
a plurality of switching elements arranged along the direction from the first feeding point toward an end of the first conductive pattern on the opposite side to the end where the first feeding point is provided,
wherein the second conductive pattern includes a second feeding point that is provided in proximity to the first feeding point and supplies a potential different from that for the first conductive pattern to the second conductive pattern,
wherein the plurality of the switching elements is electrically connected with the second conductive pattern through a plurality of bonding wires,
wherein the second conductive pattern is provided with a slit pattern that defines an area of connection of the plurality of the bonding wires with the second conductive pattern over the second conductive pattern, and
wherein a slit width of the slit pattern is monotonically increased as it goes farther away from the second feeding point in the second conductive pattern.

3. A power transistor module including one or more circuit boards in which a plurality of semiconductor elements is placed over a principal surface of an insulated substrate, wherein the circuit board includes:
  a first conductive pattern formed over the insulated substrate; and
  a second conductive pattern formed in a region over the insulated substrate different from the region of the first conductive pattern such that the second conductive pattern is electrically insulated from the first conductive pattern,
  wherein the first conductive pattern includes:
  a first feeding point for supplying a potential to the first conductive pattern located at one end thereof;
  one or more diode elements located over the first conductive pattern;
  a plurality of switching elements located over the first conductive pattern on the opposite side to the first feeding point with the diode elements in between,
  wherein the second conductive pattern includes:
  a second feeding point that is provided in proximity to the first feeding point and supplies a potential different from that for the first conductive pattern to the second conductive pattern,
  wherein the plurality of the switching elements is electrically connected with the second conductive pattern through a plurality of bonding wires,
  wherein the second conductive pattern is provided with a slit pattern that defines an area of connection of the plurality of the bonding wires with the second conductive pattern over the second conductive pattern, and
  wherein the slit pattern is formed in a U shape within the second conductive pattern and the area of connection of the plurality of the bonding wires with the second conductive pattern is provided in an area enclosed with the U-shaped slit pattern and a side of the second conductive pattern on the opposite side to a side thereof in proximity to the second feeding point.

4. The power transistor module according to claim 1, wherein the slit pattern is formed in an L shape within the second conductive pattern and the area of connection of the plurality of the bonding wires with the second conductive pattern is provided in an area enclosed with the L-shaped slit pattern and two sides of the second conductive pattern including a side of the second conductive pattern on the opposite side to a side thereof in proximity to the second feeding portion.

5. The power transistor module according to claim 1, wherein the plurality of the switching elements is placed over the first conductive pattern along the longitudinal direction of the second conductive pattern and the longitudinal direction of the slit pattern is provided along the longitudinal direction of the second conductive pattern.

6. The power transistor module according to claim 1, wherein the first conductive pattern is electrically connected with the drain electrode of at least one switching element of the plurality of the switching elements, and
wherein the second conductive pattern is electrically connected with the source electrode of at least one switching element of the plurality of the switching elements.

7. The power transistor module according to claim 1, wherein the second conductive pattern is provided with the slit pattern such that when the first feeding point and the second feeding point are respectively supplied with power of different potentials and the power transistor module is actuated, a current in the opposite direction to the direction of a current flowing through the first conductive pattern is generated in the second conductive pattern.

8. The power transistor module according to claim 1, wherein the second conductive pattern is provided with the slit pattern such that when the first feeding point and the second feeding point are respectively supplied with power of different potentials and the power transistor module is actuated, directions of currents respectively flowing through the first conductive pattern and the second conductive pattern are opposite to their respective adjoining currents.

9. The power transistor module according to claim 1, wherein the length of the slit pattern in the longitudinal direction is such a length that when the first feeding point and the second feeding point are respectively supplied with power of different potentials and the power transistor module is actuated, a difference in the value of inductance generated in the current paths of the plurality of the switching elements is minimized.

10. The power transistor module according to claim 1, wherein the length of the slit pattern in the longitudinal direction is such a length that when the first feeding point and the second feeding point are respectively supplied with power of different potentials and the power transistor module is actuated, a difference in the value of inductance generated in the current paths from a source terminal or an emitter terminal of the plurality of the switching elements to the second feeding point is minimized.

11. A power transistor module including one or more circuit boards in which a plurality of semiconductor elements is placed over a principal surface of an insulated substrate,
  wherein the circuit board includes:
  a first conductive pattern formed over the insulated substrate; and
  a second conductive pattern that is formed in a region over the insulated substrate different from the region of the first conductive pattern such that the second conductive pattern is electrically insulated from the first conductive pattern,
  wherein the first conductive pattern includes:
  a first feeding point for supplying a potential to the first conductive pattern located at one end thereof; and
  a plurality of switching elements arranged along the direction from the first feeding point toward an end of the first conductive pattern on the opposite side to the end where the first feeding point is provided,
  wherein the second conductive pattern includes a second feeding point that is provided in proximity to the first feeding point and supplies a potential different from that for the first conductive pattern to the second conductive pattern,
  wherein the plurality of the switching elements is electrically connected with the second conductive pattern through a plurality of bonding wires,
wherein the second conductive pattern is provided with a slit pattern that defines an area of connection of the plurality of the bonding wires with the second conductive pattern over the second conductive pattern, and
  wherein the slit pattern is formed in a U shape within the second conductive pattern and the area of connection of the plurality of the bonding wires with the second conductive pattern is provided in an area enclosed with the U-shaped slit pattern and a side of the second conductive pattern on the opposite side to a side thereof in proximity to the second feeding point.

12. The power transistor module according to claim 2, wherein the slit pattern is formed in an L shape within the second conductive pattern and the area of connection of the plurality of the bonding wires with the second conductive pattern is provided in an area enclosed with the L-shaped slit pattern and two sides of the second conductive pattern including a side of the second conductive pattern on the opposite side to a side thereof in proximity to the second feeding portion.

13. The power transistor module according to claim 2, wherein the plurality of the switching elements is placed over the first conductive pattern along the longitudinal direction of the second conductive pattern and the longitudinal direction of the slit pattern is provided along the longitudinal direction of the second conductive pattern.

14. The power transistor module according to claim 2, wherein the first conductive pattern is electrically connected with the drain electrode of at least one switching element of the plurality of the switching elements, and wherein the second conductive pattern is electrically connected with the source electrode of at least one switching element of the plurality of the switching elements.

15. The power transistor module according to claim 2, wherein the second conductive pattern is provided with the slit pattern such that when the first feeding point and the second feeding point are respectively supplied with power of different potentials and the power transistor module is actuated, a current in the opposite direction to the direction of a current flowing through the first conductive pattern is generated in the second conductive pattern.

16. The power transistor module according to claim 2, wherein the second conductive pattern is provided with the slit pattern such that when the first feeding point and the second feeding point are respectively supplied with power of different potentials and the power transistor module is actuated, directions of currents respectively flowing through the first conductive pattern and the second conductive pattern are opposite to their respective adjoining currents.

17. The power transistor module according to claim 2, wherein the length of the slit pattern in the longitudinal direction is such a length that when the first feeding point and the second feeding point are respectively supplied with power of different potentials and the power transistor module is actuated, a difference in the value of inductance generated in the current paths of the plurality of the switching elements is minimized.

18. The power transistor module according to claim 2, wherein the length of the slit pattern in the longitudinal direction is such a length that when the first feeding point and the second feeding point are respectively supplied with power of different potentials and the power transistor module is actuated, a difference in the value of inductance generated in the current paths from a source terminal or an emitter terminal of the plurality of the switching elements to the second feeding point is minimized.

* * * * *